(12) United States Patent
Bai et al.

(10) Patent No.: US 12,074,238 B2
(45) Date of Patent: Aug. 27, 2024

(54) SOLDER STRIP AND SOLAR CELL MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Yang Bai, Zhejiang (CN); Luchuang Wang, Zhejiang (CN); Wusong Tao, Zhejiang (CN)

(73) Assignees: Shanghai Jinko Green Energy Enterprise Management Co., Ltd., Shanghai (CN); Zhejiang Jinko Solar Co., Ltd., Zhejiang (CN)

( * ) Notice: Subject to any disclaimer, the term of this patent is extended or adjusted under 35 U.S.C. 154(b) by 0 days.

(21) Appl. No.: 17/489,543

(22) Filed: Sep. 29, 2021

(65) Prior Publication Data
US 2023/0066924 A1    Mar. 2, 2023

(30) Foreign Application Priority Data
Aug. 25, 2021   (CN) .......................... 202110980119.X

(51) Int. Cl.
*H01L 31/05*    (2014.01)
*H01L 31/02*    (2006.01)
(Continued)

(52) U.S. Cl.
CPC ...... *H01L 31/0512* (2013.01); *H01L 31/0201* (2013.01); *H01L 31/0488* (2013.01); *H01L 31/0508* (2013.01); *H01L 31/0547* (2014.12)

(58) Field of Classification Search
CPC ............ H01L 31/0512; H01L 31/0547; H01L 31/0201; H01L 31/0488; H01L 31/0508
See application file for complete search history.

(56) References Cited

U.S. PATENT DOCUMENTS 5,266,125 A * 11/1993 Rand ................... H01L 31/0475
257/E31.13
10,388,811 B2    8/2019 Wu
(Continued)

FOREIGN PATENT DOCUMENTS

CN    102201471    *    9/2011
CN    103022170 A        4/2013
(Continued)

OTHER PUBLICATIONS

Extended European Search Report received in Application No. EP 21199907.3 (Ref. 44270047EP) dated Feb. 25, 2022 in 8 pages.
(Continued)

*Primary Examiner* — Uyen M Tran
(74) *Attorney, Agent, or Firm* — Knobbe, Martens, Olson & Bear, LLP

(57) ABSTRACT

Provided is a solder strip. A cross section of the solder strip includes a base portion and a reflective portion arranged above the base portion. The reflective portion includes a top edge, a first side edge and a second side edge. A first angle is formed between the first side edge and an extension line of the top edge. A second angle is formed between the second side edge and the extension line of the top edge. The first angle and the second angle are greater than 42.5°.

9 Claims, 6 Drawing Sheets

(51) Int. Cl.
*H01L 31/048* (2014.01)
*H01L 31/054* (2014.01)

(56) References Cited

U.S. PATENT DOCUMENTS

| | | | | |
|---|---|---|---|---|
| 2004/0200522 | A1* | 10/2004 | Fukawa | H01L 31/022425 136/259 |
| 2010/0186813 | A1* | 7/2010 | Knoll | H01L 31/056 219/616 |
| 2012/0192918 | A1* | 8/2012 | Zhou | H01L 31/048 136/246 |
| 2019/0296172 | A1 | 9/2019 | Kang et al. | |

FOREIGN PATENT DOCUMENTS

| | | | |
|---|---|---|---|
| CN | 203812889 U | | 9/2014 |
| CN | 106158993 A | | 11/2016 |
| CN | 106784102 A | | 5/2017 |
| CN | 207320132 U | | 5/2018 |
| CN | 108767046 | * | 11/2018 |
| CN | 208045523 U | | 11/2018 |
| CN | 110518077 A | | 11/2019 |
| CN | 110783422 A | | 2/2020 |
| CN | 210156392 U | | 3/2020 |
| CN | 210272398 U | | 4/2020 |
| CN | 111192933 A | | 5/2020 |
| CN | 210640262 U | | 5/2020 |
| CN | 111223953 A | | 6/2020 |
| CN | 111261742 A | | 6/2020 |
| CN | 210837788 U | | 6/2020 |
| CN | 111446321 A | | 7/2020 |
| CN | 211555908 U | | 9/2020 |
| CN | 211700308 U | | 10/2020 |
| CN | 112466974 A | | 3/2021 |
| CN | 212676286 U | | 3/2021 |
| CN | 211555908 | * | 9/2022 |
| JP | 2019169711 A | | 10/2019 |
| KR | 20190089709 A | | 7/2019 |
| WO | WO 2013/030407 A1 | | 3/2013 |
| WO | WO 2016/049980 A1 | | 4/2016 |
| WO | 2020220090 A1 | | 11/2020 |
| WO | 2020220094 A1 | | 11/2020 |

OTHER PUBLICATIONS

Office Action received in Japanese Application No. JP 2021-159500 dated Dec. 23, 2010 in 23 pages.
Australian Examination report No. 1 in application No. 2021240257, dated Aug. 31, 2022, in 7 pages.
First Office Action in Chinese Application No. 202110980119 dated Oct. 31, 2023 in 15 pages.
Second Office Action of corresponding Chinese Patent Application No. 202110980119.X issued on Mar. 9, 2024 in 12 pages.

* cited by examiner

SOLDER STRIP AND SOLAR CELL MODULE

CROSS-REFERENCE TO RELATED APPLICATIONS

The present application claims priority to Chinese Patent Application No. 202110980119.X, filed on Aug. 25, 2021, the content of which is incorporated herein by reference in its entirety.

TECHNICAL FIELD

The present disclosure relates to the field of photovoltaic solder strip technologies, and in particular, to a solder strip and a solar cell module.

BACKGROUND

A solder strip is also referred to as an interconnection strip or a bus bar, and is an important raw material during soldering of a photovoltaic module. The solder strip generally connects solar cells to each other and converges currents by soldering or conductive adhesive bonding. Quality of the solder strip may directly affect efficiency of current collection of the photovoltaic module and may have a considerable influence on power of the photovoltaic module. Cross sections of solder strips are mostly rectangular.

SUMMARY

An objective of the present disclosure is to provide a solder strip and a solar cell module, so as to solve the technical problems in the related art.

The present disclosure provides a solder strip. A cross section of the solder strip includes a base portion and a reflective portion arranged above the base portion. The reflective portion includes a top edge, a first side edge and a second side edge. One end of the first side edge and one end of the second side edge continue from the top edge, and the other end of the first side edge and the other end of the second side edge continue from the base portion. A first angle is formed between the first side edge and an extension line of the top edge, and a second angle is formed between the second side edge and the extension line of the top edge. The first angle and the second angle are both acute angles formed in a range greater than 42.5°.

In an embodiment, the first angle and the second angle are formed in a range between 60° and 70°.

In an embodiment, the first side edge and/or the second side edge includes a plurality of continuous folded sections, and an angle between each of the plurality of continuous folded sections and the extension line of the bottom edge of the base portion is an acute angles formed in a range greater than 42.5°.

In an embodiment, a height of the cross-section of the solder strip is within a range of 60% to 80% of a width of the cross-section.

In an embodiment, the height of the cross-section of the solder strip is less than or equal to 0.3 mm.

In an embodiment, the base portion has a width of 0.4±0.1 mm and a height of 0.18±0.02 mm, and the reflective portion has a height of 0.09±0.01 mm In an embodiment, the base portion has a width of 0.41 mm and a height of 0.2 mm or a width of 0.4 mm and a height of 0.17 mm, and the reflective portion has a height of 0.1 mm.

In an embodiment, the base portion further includes a third side edge and a fourth side edge, and the third side edge and the fourth side edge are arranged opposite to each other. Two opposite ends of the third side edge are connected to the bottom edge and the first side edge, respectively, and a third angle is formed between the third side edge and the bottom edge. Two opposite ends of the fourth side edge are connected to the bottom edge and the second side edge, respectively, and a fourth angle is formed between the fourth side edge and the bottom edge.

In an embodiment, the third angle and the fourth angle are formed in a range between 90° and 120°.

In an embodiment, the third angle and/or the fourth angle is an acute angle.

In an embodiment, the solder strip includes a copper substrate and a solder layer coated on a surface of the copper substrate. The copper substrate is made of pure copper, oxygen-free copper or red copper, and the solder layer is made of pure tin, a tin-lead mixture or a tin-lead-silver mixture.

In an embodiment, the solder layer has a thickness in a range of 10 μm to 15 μm.

The present disclosure further provides a solar cell module. The solar cell module includes a back plate, packaging glass and a plurality of solar cells. Adjacent solar cells of the plurality of solar cells are electrically connected through a solder strip. The back plate is arranged below the plurality of solar cells, the packaging glass is located above the plurality of solar cells, and a space between the back plate and the plurality of solar cells and a space between the packaging glass and the plurality of solar cells are filled with a packaging adhesive film. The solder strip includes a main body section. A cross section of the main body section includes a base portion and a reflective portion arranged above the base portion. The reflective portion includes a top edge, a fifth side edge and a sixth side edge, and the fifth side edge and the sixth side edge are each of a convex arc-surface structure. One end of the fifth side edge and one end of the sixth side edge continue from the top edge, and the other end of the fifth side edge and the other end of the sixth side edge continue from the base portion. A fifth angle is formed between a tangent line of a midpoint of the fifth side edge and an extension line of a bottom edge of the base portion, and a sixth angle is formed between a tangent line of a midpoint of the sixth side edge and the extension line of the bottom edge of the base portion. The fifth angle and the sixth angle are both acute angles formed in a range greater than 42.5°.

In an embodiment, the solder strip further includes a flat section connected to the main body section. The main body section is welded to a busbar of the plurality of solar cells, and the flat section is located between two of the plurality of solar cells.

In an embodiment, the flat section is of a flat elongated strip structure, and a bottom edge of the flat section is parallel to a bottom edge of the base portion.

In an embodiment, the fifth angle and the sixth angle are formed in a range between 60° and 70°.

In an embodiment, a height of the cross-section of the solder strip is within a range of 60% to 80% of a width of the cross-section.

In an embodiment, the height of the cross-section of the solder strip is less than or equal to 0.3 mm.

In an embodiment, the base portion has a width of 0.4±0.1 mm and a height of 0.18±0.02 mm, and the reflective portion has a height of 0.09±0.01 mm In an embodiment, the base portion has a width of 0.41 mm and a height of 0.2 mm or a width of 0.4 mm and a height of 0.17 mm, and the reflective portion has a height of 0.1 mm.

In an embodiment, the base portion further includes a seventh side edge and an eighth side edge, the seventh side edge and the eighth side edge being arranged opposite to each other. Two opposite ends of the seventh side edge are connected to the bottom edge and the fifth side edge, respectively. Two opposite ends of the eighth side edge are connected to the bottom edge and the sixth side edge respectively. An arc-surface transition is formed between the seventh side edge and the bottom edge and between the eighth side edge and the bottom edge.

In an embodiment, an agglomeration layer is formed between the base portion and the plurality of solar cells, and the agglomeration layer is formed by molten accumulation of the solder layer.

Reference signs: 1: base portion; 2: reflective portion; 3: top edge; 4: first side edge; 5: second side edge; 6: first angle; 7: second angle; 8: bottom edge; 9: third side edge; 10: fourth side edge; 11: third angle; 114: fourth angle; 12: back plate; 13: packaging glass; 14: solar cell; 15: packaging adhesive film; 16: solder strip; 17: copper substrate; 18: solder layer; 19: folded section; 20: fifth side edge; 21: sixth side edge; 22: seventh side edge; 23: eighth side edge; 24: fifth angle; 25: sixth angle.

DETAILED DESCRIPTION

Embodiments described below with reference to the accompanying drawings are exemplary and intended only to illustrate the present disclosure, which cannot be construed as limitations to the present disclosure.

Embodiment 1

Figure 1:
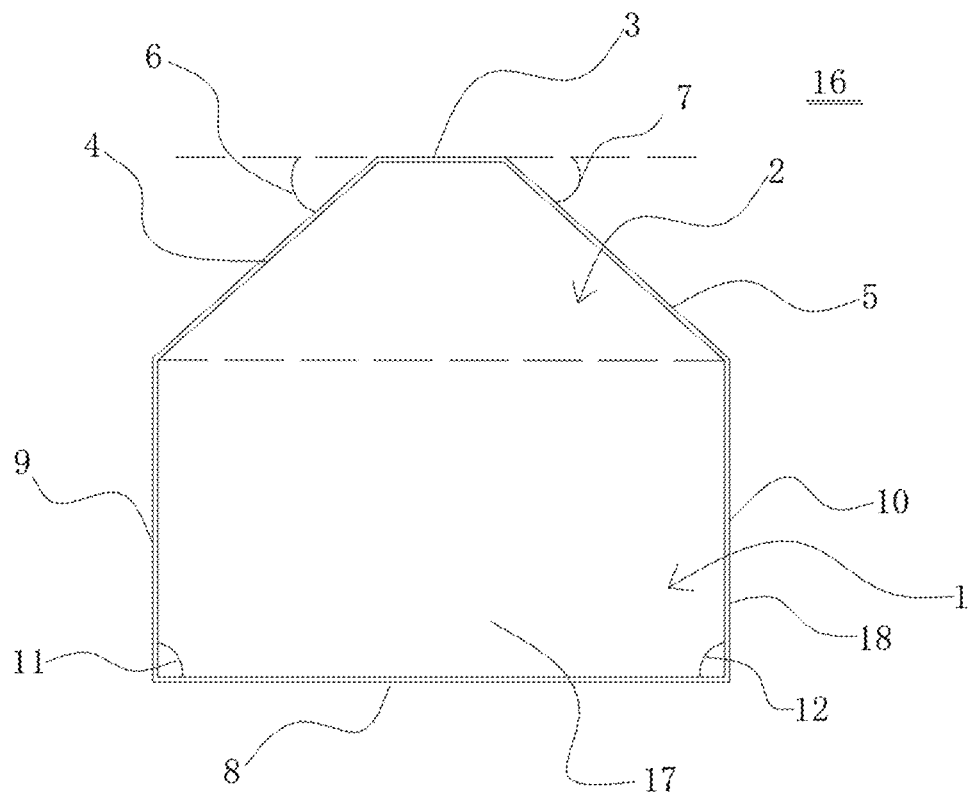
FIG. 1 is a schematic structural diagram according to Embodiment 1 of the present disclosure.
Figure 2:
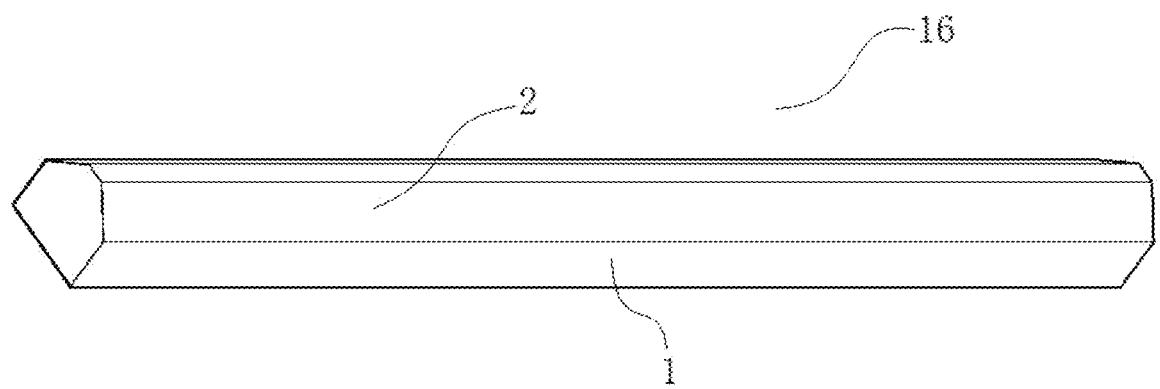
FIG. 2 is an isometric diagram according to Embodiment 1 of the present disclosure.

As shown in FIG. 1 and FIG. 2, an embodiment of the present disclosure provides a solder strip 16. The solder strip 16 is of an elongated strip structure. A cross section of the solder strip 16 includes a base portion 1 and a reflective portion 2 arranged above the base portion 1. The reflective portion 2 and the base portion 1 may have an integrated structure, and the division into two parts is only for functional description. The reflective portion 2 includes a top edge 3, a first side edge 4 and a second side edge 5. One end of the first side edge 4 and one end of the second side edge 5 continue from the top edge 3. The other end of the first side edge 4 and the other end of the second side edge 5 continue from the base portion 1. A first angle 6 is formed between the first side edge 4 and an extension line of a bottom edge 8 of the base portion 1, a second angle 7 is formed between the second side edge 5 and the extension line of the bottom edge 8 of the base portion 1, and the first angle 6 and the second angle 7 are both greater than 42.5° and less than 90° (excluding 90°).

Figure 5:
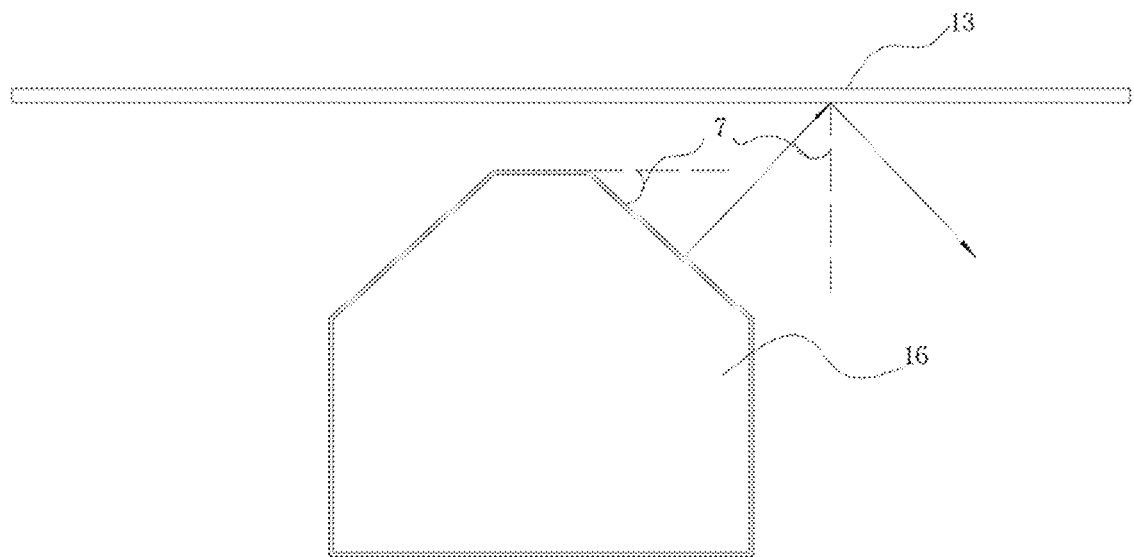
FIG. 5 is a schematic structural diagram of reflected light of a solder strip according to Embodiment 1 of the present disclosure.

In the present embodiment, when the first angle 6 and/or the second angle 7 are/is greater than 42.5° and less than 90°, referring to FIG. 5, after reflected light incident on the solder strip 16 in a direction perpendicular to the second side edge 5 strikes packaging glass 13, an incident angle (an angle between the reflected light and a normal line of the packaging glass 13) is equal to the second angle 7. According to a principle of total reflection of light, the reflected light incident on the solder strip 16 may be totally reflected at a glass and air interface layer of the solar cell module, so that the sunlight totally reflected re-participates in photoelectric conversion and thus improves the utilization of the reflected light.

In an embodiment, when the first angle 6 and the second angle 7 are greater than 42.5° (42.5° is a critical angle at which the sunlight is totally reflected at a glass and air interface layer of a photovoltaic cell module), the reflected light on the solder strip 16 may be totally reflected to a solar cell 14 to participate in photoelectric conversion after the first angle 6 and the second angle 7 are equal to or greater than the critical angle. If the first angle 6 and the second angle 7 are less than the angle, the reflected light on the solder strip 16 cannot meet requirements on total reflection and may pass through the packaging glass 13 of the solar cell module, and thus cannot be utilized.

Furthermore, the first angle 6 is equal to the second angle 7, that is, the first side edge 4 and the second side edge 5 are arranged symmetrically with respect to a perpendicular bisector of the bottom edge 8 of the base portion 1, which has a symmetrically distributed structure, facilitates processing and forming, and can evenly reflect the sunlight to the solar cells 14 on two sides, so as to improve reflection efficiency.

Furthermore, if the first angle 6 and the second angle 7 are between 60° and 70°, on the one hand, a purpose that the first angle 6 and the second angle 7 are greater than the critical angle at which the sunlight is totally reflected at the glass and air interface layer of the photovoltaic cell module can be achieved. On the other hand, accumulation caused by melting of a solder layer 18 during the soldering of the solder strip 16 is also prevented, so that thicknesses of the first side edge 4 and the second side edge 5 are increased, thereby reducing the first angle 6 and the second angle 7. The first angle 6 and the second angle 7 are both set to 60° to 70° so that a margin can be remained. In a case where the solder layer 18 is accumulated, the first angle 6 and the second angle 7 are still greater than the critical angle at which the sunlight is totally reflected at the glass and air interface layer of the solar cell module.

Further, when the height of the cross-section of the solder strip 16 is designed to be less than 0.3 mm, in a case where the solder strip 16 has a same copper substrate 17 as a round-wire solder strip 16 (i.e., a same power is maintained), a weight of a packaging adhesive film 15 can be reduced due to a reduced height of the solder strip 16, so as to reduce costs. After the solder strip 16 is welded to the solar cell 14, a space between the solar cell 14 and the packaging glass 13 may be filled with the packaging adhesive film 15. The height of the solder strip 16 may determine a gap between the solar cell 14 and the packaging glass 13. In a case where the height of the solder strip 16 is reduced, the gap between the solar cell 14 and the packaging glass 13 may also be reduced, thereby reducing a volume of the filled packaging adhesive film 15.

Furthermore, the base portion 1 has a width of 0.4±0.1 mm and a height of 0.18±0.02 mm; and the reflective portion 2 has a height of 0.09±0.01 mm. Therefore, compared with the height, the width of the solder strip 16 has a certain amount of expansion, which results in that the solder strip is not easily turned over during the soldering and solves the problem of difficulty in a soldering process of the triangular solder strip in the related art.

Figure 3:
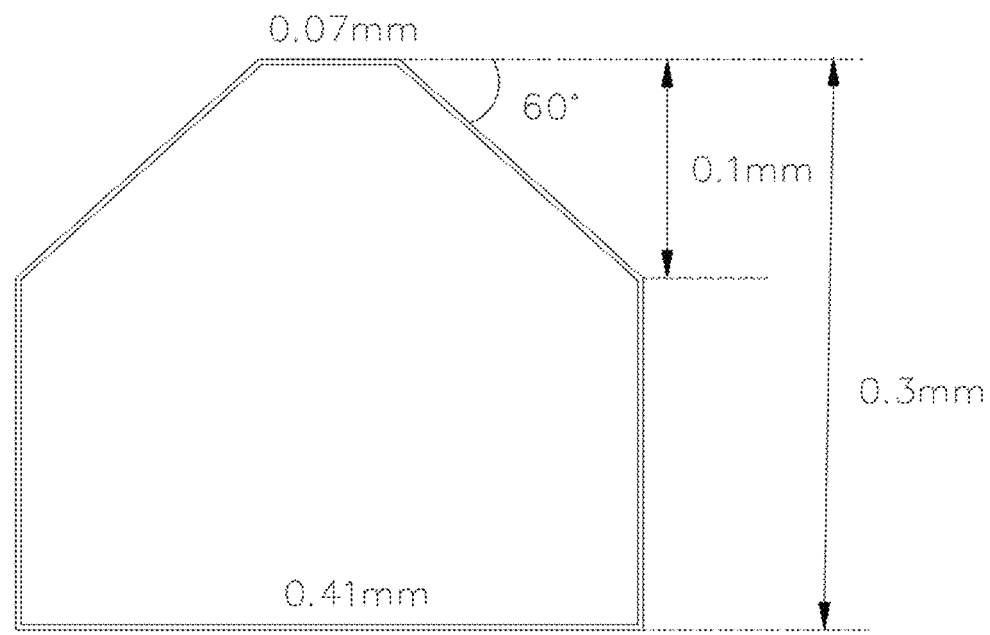
FIG. 3 is a schematic structural diagram shown in a dimension according to Embodiment 1 of the present disclosure.

Referring to FIG. 3, in an example, the solder strip 16 is 0.3 mm high and 0.41 mm wide, and is compared with a round-wire segmented soldering wire with a same copper substrate 17.

1. Cost

Given 0.3 mm*0.41 mm, the height is 0.3 mm, and a low-weight adhesive film packaging material may be used compared with the solder strip with a round wire of 0.35 mm. The cost of a single adhesive film of the module can be reduced by 4-5 RMB.

2. Power

By taking a 182-72HC module as an example, due to the design of reflection, power of a T-shaped solder strip 16 of 0.3 mm*0.41 mm may be increased by about 1 W compared with the module with a round wire of 0.35 mm.

Figure 4:
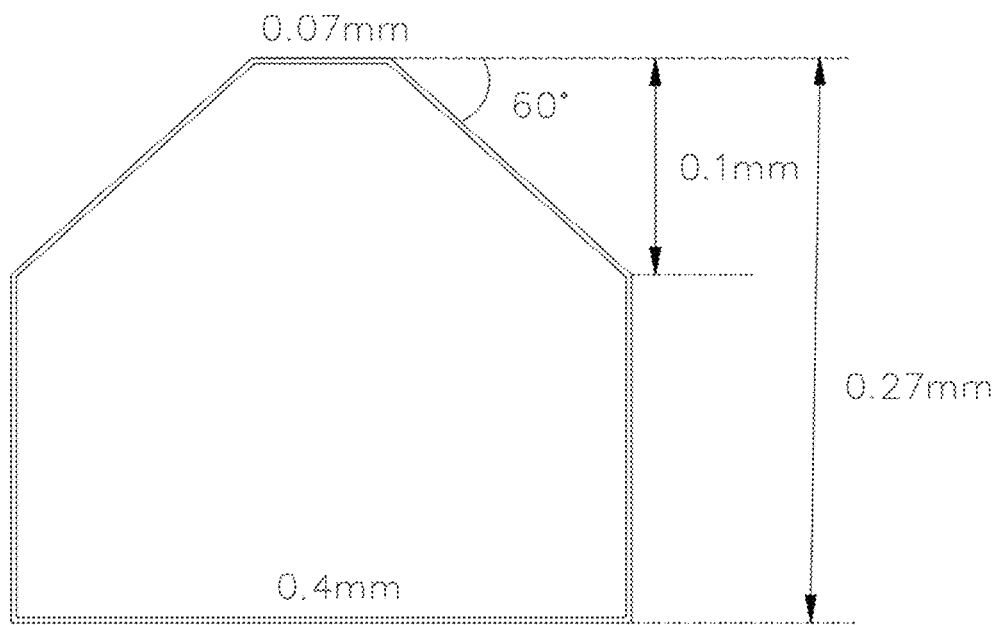
FIG. 4 is a schematic structural diagram shown in another dimension according to Embodiment 1 of the present disclosure.

Referring to FIG. 4, in an example, the solder strip 16 is 0.27 mm high and 0.4 mm wide, and is compared with a round-wire segmented soldering wire with a same copper substrate 17.

1. Cost

According to 0.27 mm*0.4 mm, the height is 0.27 mm, and a low-weight adhesive film packaging material may be used compared with the solder strip with a round wire of 0.35 mm. The cost of a single adhesive film of the module can be reduced by 4.3-5.3 RMB.

2. Power

By taking a 182-72HC module as an example, due to the design of reflection, power of a T-shaped solder strip 16 of 0.27 mm*0.4 mm may be increased by about 1 W compared with the module with a round wire of 0.35 mm.

Figure 11:
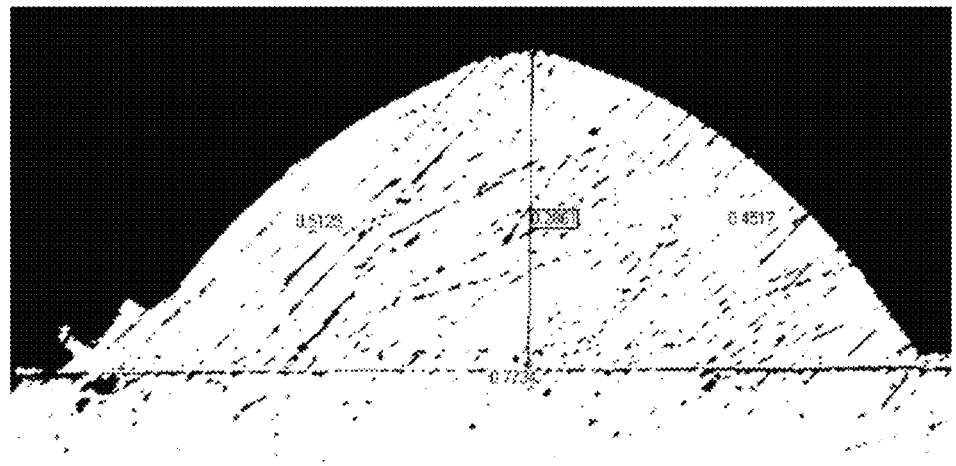
FIG. 11 is a schematic structural diagram of agglomeration of a beveled solder layer after soldering of a triangular solder strip in the related art.

In the related art, as shown in FIG. 11, the solder strip has a triangular section. Although the design is intended to provide two bevel side edges as effective side edges so as to increase an effective reflective light multiplexing area, after soldering, the solder layer on the bevel side edge may be melted and agglomerate in a middle part of the bevel side edge. As a result, after the soldering, two bevel side edges of the solder strip may change from a bevel surface to an arc-like surface that protrudes in the middle. A round-wire-like surface leads to loss of reflective multiplexing capability.

Figure 12:
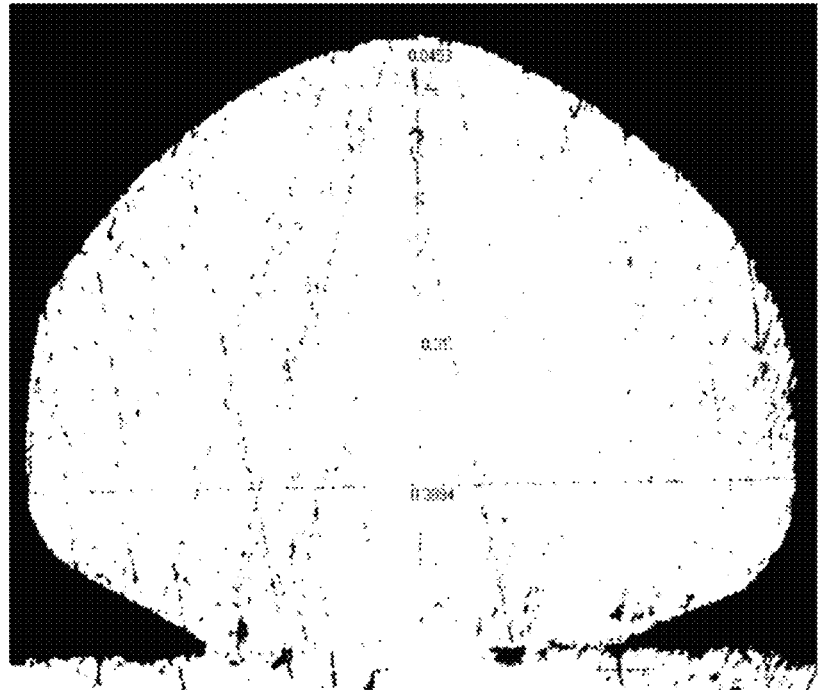
FIG. 12 is a schematic structural diagram of agglomeration of a solder layer of a solder strip of a solar cell module according to the present disclosure.

In order to solve the above technical problem, the base portion 1 further includes a third side edge 9 and a fourth side edge 10, and the third side edge 9 and the fourth side edge 10 are arranged opposite to each other. Two opposite ends of the third side edge 9 are connected to the bottom edge 8 and the first side edge 4 respectively, and a third angle 11 is formed between the third side edge 9 and the bottom edge 8. Two opposite ends of the fourth side edge 10 are connected to the bottom edge 8 and the second side edge 5, respectively, and a fourth angle 114 is formed between the fourth side edge 10 and the bottom edge 8. The third angle 11 and the fourth angle 114 may be right angles, so as to form a structure with an isosceles trapezoid at a top and a rectangle at a bottom, which meets requirements on light reflection, unlike the triangular solder strip 16, this will prevent agglomeration of the solder layer 18 after soldering of the bevel side edge. As shown in FIG. 12, an agglomeration layer is formed between the base portion 1 and the solar cell 14. The solder layer 18 slides to the bottom, while the solder layer 18 does not agglomerate at the bevel side edge, which brings a good light reflection effect.

Further, the third angle 11 and the fourth angle 114 are obtuse angles, and may be 120°. That is, the third side edge 9 and the fourth side edge 10 gradually tilt inward from top to bottom to form a rhomboid structure. After the soldering, since the third side edge 9 and the fourth side edge 10 tilt inward, the third side edge 9 and the fourth side edge 10 form an accommodating space with the top of the solar cell 14 compared with the design of the rectangular structure of the base portion. Therefore, after the soldering, the solder layer 18 slides from the first side edge 4 and the second side edge 5 to accumulate in the accommodating space, thereby reducing the shielding of a surface of the solar cell 14.

The solder strip 16 includes a copper substrate 17 and a solder layer 18 coated on a surface of the copper substrate 17. The copper substrate 17 is made of pure copper, oxygen-free copper or red copper, and the solder layer 18 is made of pure tin, a tin-lead mixture or a tin-lead-silver mixture. The copper substrate 17 is configured for current transmission, and the solder layer 18 is configured for soldering with a gate line on the surface of the solar cell 14. A thickness of the solder layer 18 is controlled at 10 μm and 15 μm, which is uniformly coated on the copper substrate 17.

Embodiment 2

A main difference between the present embodiment and Embodiment 1 is as follows.

Figure 6:
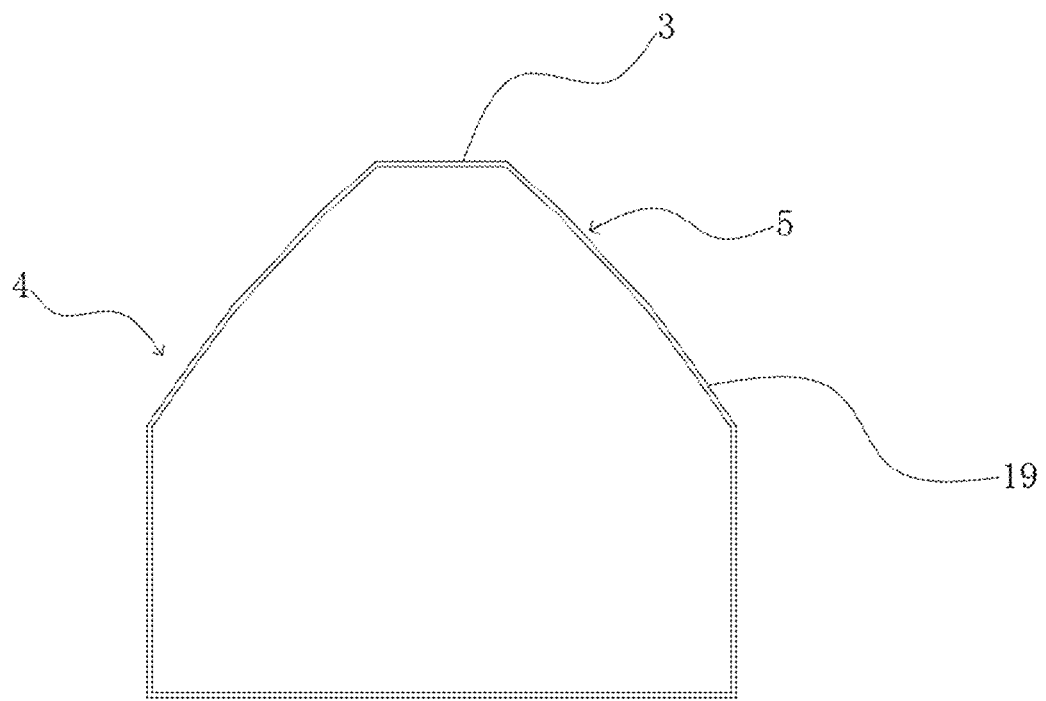
FIG. 6 is a schematic structural diagram according to Embodiment 2 of the present disclosure.

In Embodiment 1, the first side edge 4 and/or the second side edge 5 is an approximately smooth surface, and reflected light is at a single angle and has a limited coverage. In the present embodiment, referring to FIG. 6 and FIG. 7, the first side edge 4 and/or the second side edge 5 include/includes a plurality of continuous folded sections 19. Angles between the plurality of continuous folded sections 19 and the extension line of the bottom edge 8 of the base portion 1 are greater than the preset angle. In this way, each folded section 19 reflects sunlight at different angles, thereby improving the coverage of the sunlight that re-participates in photoelectric conversion.

Figure 7:
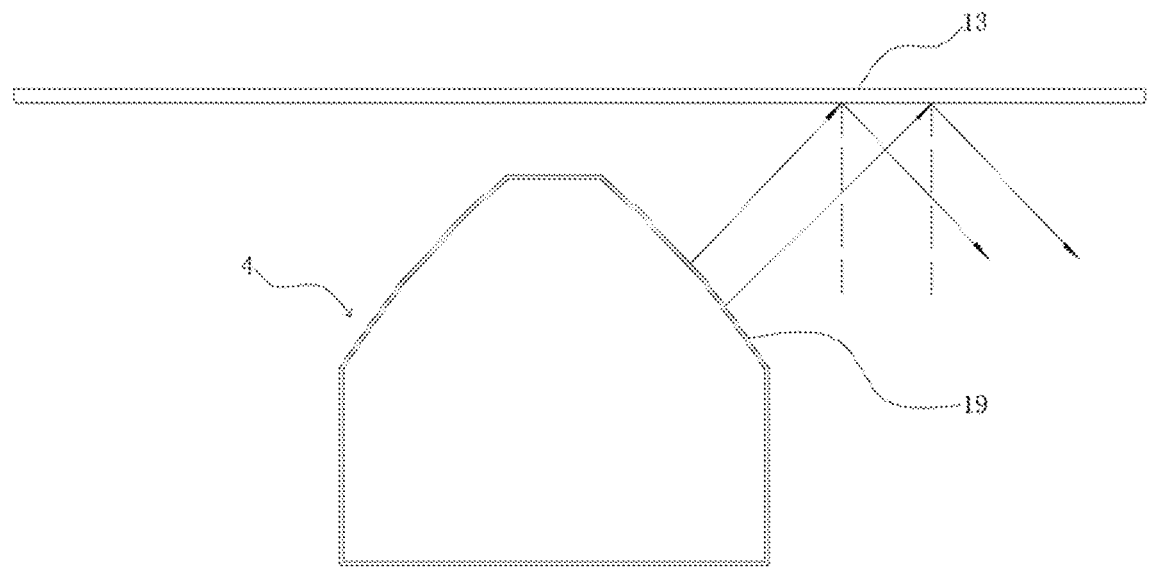
FIG. 7 is a schematic structural diagram of reflected light of a solder strip according to Embodiment 2 of the present disclosure.

Referring to FIG. 7, after reflected light on the solder strip 16 perpendicular to the folded section 19 strikes the packaging glass 13, an incident angle (an angle between the reflected light and a normal line of the packaging glass 13) is equal to the second angle 7. According to the principle of total reflection of light, the reflected light on the solder strip 16 may be totally reflected at a glass and air interface layer of the solar cell module, so that the sunlight totally reflected re-participates in photoelectric conversion and thus improves the utilization of the reflected light.

Furthermore, the angle between the folded section 19 and the extension line of the bottom edge 8 of the base portion 1 increases sequentially from top to bottom to form a progressively inclined surface with a certain gradient, so that the solder layer can slide down along each folded section 19 during melting, so as not to produce agglomeration on the first side edge 4 and/or the second side edge 5 to adversely affect the light reflection effect and reduce the utilization of the sunlight.

Figure 8:
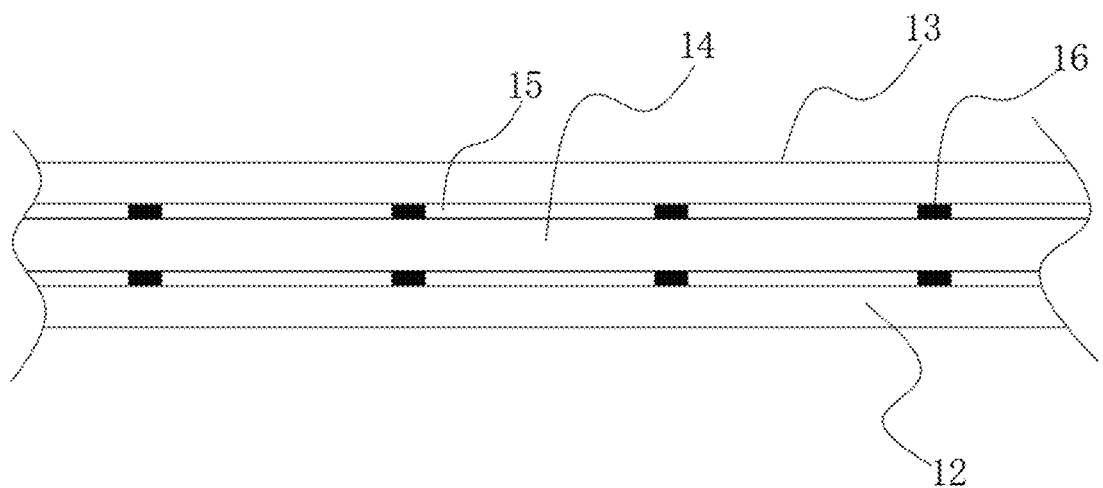
FIG. 8 is a schematic structural diagram of a solar cell module.
Figure 9:
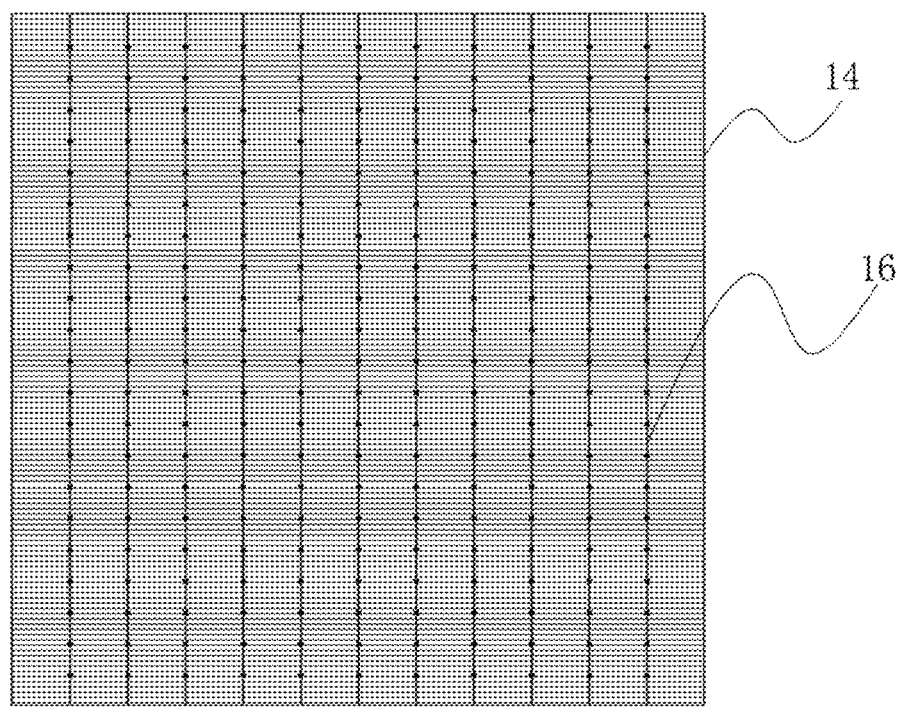
FIG. 9 is a top view of a solar cell module.

The present disclosure further provides a solar cell module. Referring to FIG. 8 and FIG. 9, the solar cell module includes solar cells 14 and the solder strip 16 described above. The base portion 1 of the solder strip 16 is welded to the solar cells 14. Adjacent solar cells 14 are electrically connected to each other through the solder strip 16, and a current is transmitted by the solder strip 16.

Figure 10:
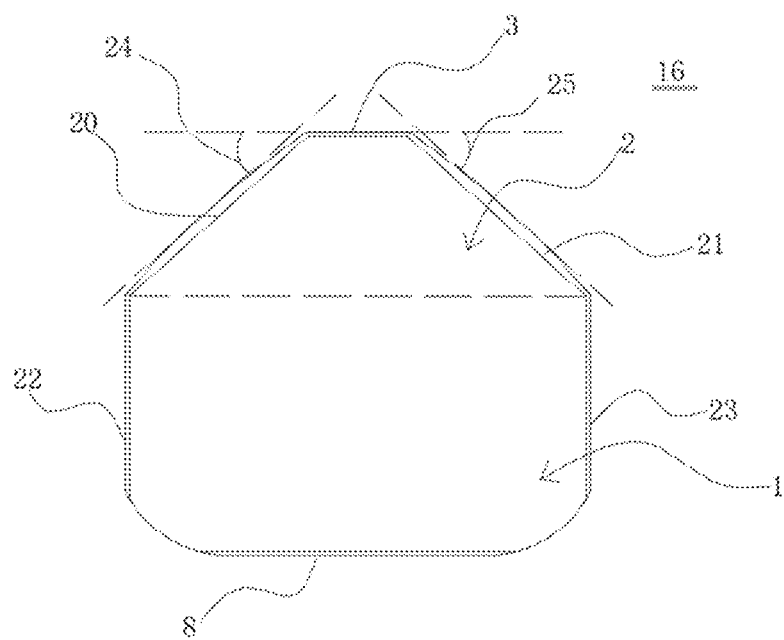
FIG. 10 is a schematic structural diagram of a solder strip of a solar cell module.

Referring to FIG. 10, a cross section of the solder strip 16 includes a base portion 1 and a reflective portion 2 arranged above the base portion 1. The reflective portion 2 includes a top edge 3, a fifth side edge 20 and a sixth side edge 21. Due to solder melting of the solder layer 18 (especially at a position near a soldering spot) of the solder strip 16 during the soldering, a certain flow accumulation occurs, resulting in slightly protruding arc-surface structures of the fifth side edge 20 and the sixth side edge 21. At the same time, the top edge 3 may also be an arc-surface structure, which is connected to the fifth side edge 20 and the sixth side edge 21. One end of the fifth side edge 20 and one end of the sixth side edge 21 continue from the top edge 3. The other end of the fifth side edge 20 and the other end of the sixth side edge 21 continue from the base portion 1. A fifth angle 24 is formed between a tangent line of the fifth side edge 20 and an extension line of a bottom edge of the base portion 1. A sixth angle 25 is formed between a tangent line of the sixth side edge 21 and the extension line of the bottom edge of the base portion 1. The tangent lines of the fifth side edge 20 and the sixth side edge 21 are tangent lines of the farthest point of a convex arc surface. The fifth angle 24 and the sixth angle 25 are between 42.5° and 90° (excluding 90°).

After the soldering of the solder strip 16, the solder layer 18 melts, and the fifth side edge 20 and the sixth side edge 21 form a convex arc-surface structure. Angles between tangent lines of midpoints of the fifth side edge 20 and the sixth side edge 21 and the extension line of the bottom edge 8 of the base portion 1 are greater than 42.5°. The midpoints of the fifth side edge 20 and the sixth side edge 21 are located at most protruding points of the arc-surface structure. In an embodiment, the midpoint is in the middle of the arc-surface structure and on the solder strip 16. After reflected light incident in a direction perpendicular to the fifth side edge 20 and the sixth side edge 21 strikes the packaging glass 13, an incident angle (an angle between the reflected light and a normal line of the packaging glass 13) is equal to the fifth angle 24 and the sixth angle 25. According to the principle of total reflection of light, the reflected light on the solder strip 16 may be totally reflected at a glass and air interface layer of the solar cell module, so that the sunlight totally reflected re-participates in photoelectric conversion and thus improves the utilization of the reflected light.

Furthermore, the solder strip 16 includes a main body section and a flat section. The main body section is configured to be welded to a busbar of the solar cell 14. The flat section is located between two adjacent solar cells 14, which eliminates spacing between solar cells and increases power of the module per unit area. The flat section in the middle reduces a vertical spacing between the solar cells 14, reduces ethylene vinyl acetate (EVA) consumption, reduces hidden cracks, and improves the reliability of a photovoltaic module.

Further, the flat section is of a flat elongated strip structure, and a bottom edge of the flat section is parallel to that of the base portion, so as to prevent turnover of the solder strip during the soldering.

The solar cell module further includes packaging glass 13 and a back plate 12. The back plate 12 is arranged below the solar cell 14. The packaging glass 13 is located above the solar cell 14. A space between the packaging glass 13 and the solar cell 14 is filled with a packaging adhesive film 15.

Furthermore, the base portion 1 further includes a seventh side edge 22 and an eighth side edge 23, and the seventh side edge 22 and the eighth side edge 23 are arranged opposite to each other. Two opposite ends of the seventh side edge 22 are connected to the bottom edge 8 and the fifth side edge 20 respectively, two opposite ends of the eighth side edge 23 are connected to the bottom edge 8 and the sixth side edge 21 respectively, and arc-surface transition is formed between the seventh side edge 22 and the bottom edge 8 and between the eighth side edge 23 and the bottom edge 8.

Since arc-surface transition is formed between the seventh side edge 22 and the bottom edge 8 and between the eighth side edge 23 and the bottom edge 8, the design of fillet is increased compared with the rectangular base portion, which is conducive to the accumulation of the solder layer 18 at the bottom of the solder strip 16 and helps to reduce collision damages to the solar cell 14.

Furthermore, if the fifth angle 24 and the sixth angle 25 are between 60° and 70°, on the one hand, a purpose that the fifth angle 24 and the sixth angle 25 are greater than the critical angle at which the sunlight is totally reflected at the glass and air interface layer of the photovoltaic cell module can be achieved. On the other hand, accumulation caused by melting of a solder layer 18 during the soldering of the solder strip 16 is also prevented, so that thicknesses of the fifth side edge 20 and the sixth side edge 21 are increased, thereby reducing the fifth angle 24 and the sixth angle 25. The fifth angle 24 and the sixth angle 25 are both set to 60° to 70° so that a margin can be remained. In a case where the solder layer 18 is accumulated, the fifth angle 24 and the sixth angle 25 are still greater than the critical angle at which the sunlight is totally reflected at the glass and air interface layer of the solar cell module.

Further, when the height of the cross-section of the solder strip 16 is designed to be less than 0.3 mm, in the case of a same copper substrate 17 with a round-wire solder strip 16 (i.e. a same power is maintained), the weight of a packaging adhesive film 15 can be reduced due to a reduced height of the solder strip 16, so as to reduce costs. After the solder strip 16 is welded to the solar cell 14, a space between the solar cell 14 and the packaging glass 13 may be filled with the packaging adhesive film 15. The height of the solder strip 16 may determine a gap between the solar cell 14 and the packaging glass 13. In a case where the height of the solder strip 16 is reduced, the gap between the solar cell 14 and the packaging glass 13 may also be reduced, thereby reducing a volume of the filled packaging adhesive film 15.

Furthermore, the base portion 1 has a width of 0.4±0.1 mm and a height of 0.18±0.02 mm; and the reflective portion 2 has a height of 0.09±0.01 mm. Therefore, compared with the height, the width of the solder strip 16 has a certain amount of expansion, which is easily turned over during soldering and solves the problem of difficulty in a soldering process of the triangular solder strip in the related art. After the soldering of the solder strip 16, as shown in FIG. 12, an agglomeration layer is formed between the base portion 1 and the solar cell 14. The solder layer 18 slides to the bottom, the solder layer 18 does not agglomerate at a bevel side edge of a trapezoidal structure of the solder strip 16, and the solder layer 18 of the solder strip 16 agglomerates only at the bottom of the base portion 1, thereby bringing a good light reflection effect.

The structure, features and effects of the present disclosure are described in detail above according to the embodiments shown in the drawings. The above are only preferred embodiments of the present disclosure, but the present disclosure does not limit the scope of implementation as illustrated in the drawings. Any changes made in accordance with the conception of the present disclosure, or equivalent embodiments modified as equivalent changes, which still do not exceed the spirit covered by the specification and the drawings, shall fall within the protection scope of the present disclosure.

What is claimed is:

1. A solder strip, wherein the solder strip comprises a main body section and a flat section connected to the main body section, a cross-section of the main body section of the solder strip comprises a base portion and a reflective portion arranged above the base portion;

the reflective portion includes a top edge, a first side edge and a second side edge, one end of the first side edge and one end of the second side edge continue from the top edge, and the other end of the first side edge and the other end of the second side edge continue from the base portion; and a first angle is formed between the first side edge and an extension line of a bottom edge of the base portion, a second angle is formed between the second side edge and the extension line of the bottom edge of the base portion, and the first angle and the second angle are both acute angles formed in a range greater than 42.5°, wherein a height of the cross-section of the solder strip is less than or equal to 0.3 mm, wherein the base portion has a width of 0.4±0.1 mm and a height of 0.18±0.02 mm, and the reflective portion has a height of 0.09±0.01 mm, wherein the solder strip comprises a copper substrate and a solder layer coated on a surface of the copper substrate, and wherein the solder layer has a thickness in a range of 10 μm to 15 μm, wherein the first side edge or the second side edge includes at least three continuous folded sections, and an angle formed between each section of the at least three continuous folded sections and the extension line of the bottom edge of the base portion is an acute angle greater than 42.5°.

2. The solder strip according to claim 1, wherein the first angle and the second angle are formed in a range between 60° and 70°.

3. The solder strip according to claim 1, wherein the height of the cross-section of the solder strip is within a range of 60% to 80% of a width of the cross-section of the solder strip.

4. The solder strip according to claim 1, wherein the base portion has the width of 0.41 mm and the height of 0.2 mm or the width of 0.4 mm and the height of 0.17 mm, and the reflective portion has the height of 0.1 mm.

5. The solder strip according to claim 1, wherein the base portion further comprises a third side edge and a fourth side edge, and the third side edge and the fourth side edge are arranged opposite to each other, wherein two opposite ends of the third side edge are connected to the bottom edge and the first side edge, respectively, and a third angle is formed between the third side edge and the bottom edge;

two opposite ends of the fourth side edge are connected to the bottom edge and the second side edge, respectively, and a fourth angle is formed between the fourth side edge and the bottom edge; and the third angle and the fourth angle are formed in a range between 90° and 120°.

6. The solder strip according to claim 1, wherein the copper substrate is made of pure copper, oxygen-free copper or red copper, and the solder layer is made of pure tin, a tin-lead mixture or a tin-lead-silver mixture.

7. The solder strip according to claim 1, wherein the flat section is of a flat elongated strip structure, and a bottom edge of the flat section is parallel to a bottom edge of the base portion.

8. The solder strip according to claim 1, wherein an agglomeration formed by molten accumulation of the solder layer is located lower at two sides of the base portion and away from the first side edge and the second side edge of the reflective portion.

9. The solder strip according to claim 8, wherein the bottom edge of the base portion is chamfered or beveled to accommodate the agglomeration.

* * * * *